United States Patent
Lai et al.

(10) Patent No.: US 9,524,968 B1
(45) Date of Patent: Dec. 20, 2016

(54) SEMICONDUCTOR DEVICE HAVING METAL GATE AND FABRICATION METHOD THEREOF

(71) Applicant: UNITED MICROELECTRONICS CORP., Hsin-Chu (TW)

(72) Inventors: Chien-Ming Lai, Tainan (TW); Ya-Huei Tsai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/836,966

(22) Filed: Aug. 27, 2015

(30) Foreign Application Priority Data

Jul. 23, 2015 (TW) .............................. 104123810 A

(51) Int. Cl.
| | |
|---|---|
| H01L 21/02 | (2006.01) |
| H01L 27/092 | (2006.01) |
| H01L 21/8238 | (2006.01) |
| H01L 21/28 | (2006.01) |
| H01L 21/3213 | (2006.01) |
| H01L 29/49 | (2006.01) |
| H01L 29/66 | (2006.01) |

(52) U.S. Cl.
CPC ..... *H01L 27/0922* (2013.01); *H01L 21/28088* (2013.01); *H01L 21/32134* (2013.01); *H01L 21/823842* (2013.01); *H01L 29/4966* (2013.01); *H01L 21/8238* (2013.01); *H01L 29/49* (2013.01); *H01L 29/66545* (2013.01)

(58) Field of Classification Search
CPC ............. H01L 27/0922; H01L 21/8238; H01L 21/823842; H01L 21/28088; H01L 21/32134; H01L 29/4966; H01L 29/49; H01L 29/66545
See application file for complete search history.

(56) References Cited

U.S. PATENT DOCUMENTS

| | | | |
|---|---|---|---|
| 7,390,709 B2 | 6/2008 | Doczy | |
| 7,439,113 B2 | 10/2008 | Doczy | |
| 9,230,864 B1* | 1/2016 | Lu | ........................ H01L 29/7831 |
| 2013/0102145 A1* | 4/2013 | Huang | .............. H01L 21/32139 438/595 |
| 2013/0168744 A1* | 7/2013 | Hsu | .................. H01L 21/823842 257/288 |
| 2014/0054654 A1* | 2/2014 | Hsieh | ...................... H01L 29/78 257/288 |
| 2015/0061042 A1* | 3/2015 | Cheng | ................. H01L 29/4966 257/412 |

* cited by examiner

*Primary Examiner* — Nicholas Tobergte
(74) *Attorney, Agent, or Firm* — Winston Hsu; Scott Margo

(57) ABSTRACT

A fabrication method of semiconductor device having metal gate includes providing a substrate, successively forming a gate insulating layer and a bottom barrier layer on the surface of the substrate, forming a work function layer covering the bottom barrier layer, removing the work function layer, and forming a top barrier layer on the bottom barrier layer to be directly contact with the bottom barrier layer, and forming a metal layer on the top bottom barrier layer.

11 Claims, 11 Drawing Sheets

SEMICONDUCTOR DEVICE HAVING METAL GATE AND FABRICATION METHOD THEREOF

BACKGROUND OF THE INVENTION

1. Field of the Invention

The present invention is related to a semiconductor device having metal gate and fabrication method thereof, and more particularly, to a semiconductor device having metal gate and fabrication method thereof with a good hole-filling performance of gate material.

2. Description of the Prior Art

With a trend toward scaling down the size of the semiconductor device, work function metals are used to replace the conventional polysilicon gate to be the control electrode that is competent to the high dielectric constant (herein after abbreviated as high-k) gate dielectric layer. In a conventional fabrication method of work function metal gate, a polysilicon dummy gate (or called as "replacement gate") is formed and followed by steps of forming a conventional metal-oxide semiconductor (MOS), such as forming spacer and source/drain. Subsequently, the polysilicon dummy gate is removed to form a gate trench. Thereafter, the gate trench is filled with material layers required for different conductivity types, such as gate insulating layer, work function layer and metal layer. However, the aspect ratio of the gate trench is kept on being raised in the developing requirement, resulted in that the difficulty of filling the gate trench with layers becomes higher and higher. Accordingly, voids are easily formed in the gate trench during hole-filling processes, which seriously affect the electric performance of the transistor. Furthermore, in a prior-art fabrication process, a pull-down process of the inner layers of the gate trench is required for enlarging the opening size of inner surface of the gate trench in order to improve the hole-filling performance. However, the above-mentioned pull-down process further complicates the whole fabrication process. As a result, it is still an important issue for the manufacturer to improve the fabrication yield of the metal gate of semiconductor device by simplified process.

SUMMARY OF THE INVENTION

Therefore, it is one of the main objects of the present invention to provide a fabrication method of semiconductor device having metal gate and a semiconductor device having metal gate with improved hole-filling performance of metal gate, wherein the metal gate structure does not have work function material layer.

According to an embodiment of the present invention, a fabrication method of a semiconductor device having metal gate is provided. The fabrication method includes providing a substrate, forming a gate insulating layer on a surface of the substrate, forming a bottom barrier layer on the gate insulating layer, forming a work function layer on the bottom barrier layer to cover the bottom barrier layer, removing the work function layer, forming a top barrier layer on the bottom barrier layer to make the top barrier layer be directly in contact with the bottom barrier layer, and then forming a metal layer on the top barrier layer.

According to an embodiment of the present invention, a semiconductor device having metal gate is further provided. The semiconductor device includes a substrate, a first metal gate structure, and a second metal gate structure. The first metal gate structure is disposed in a first device region on the substrate, including a gate insulating layer and a first bottom barrier layer disposed on the substrate in order, a top barrier layer disposed on the surface of the first bottom barrier layer and directly in contact with the first bottom barrier layer, and a metal layer disposed on the top barrier layer. The second metal gate structure is disposed in a second device region on the substrate, and includes the gate insulating layer and a second bottom barrier layer disposed on the substrate in order, the top barrier layer disposed on the second bottom barrier layer and directly in contact with the second bottom barrier layer, and the metal layer disposed on the top barrier layer. Wherein, the first bottom barrier layer and the second bottom barrier layer have different impurity compositions.

According to the present invention, the metal gates of both of the first metal gate structure and the second metal gate structure of the semiconductor device do not have work function material layer, such that the pull-down process of the work function material layers is not required, so as to simplify the fabrication process. Moreover, the aspect ratio of the gate trench is decreased for the following formation process of the inner layers of the gate trench, and therefore the performance of hole-filling process of the top barrier layer and metal layer could be effective raised, so as to improve the electric performance of the gate structure. In addition, the first metal gate structure and the second metal gate structure have similar or identical layer stacking structure, thus the process window and process selectivity of the following fabrication processes could be raised and the fabrication yield is improved with simplified process accordingly.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 to FIG. 10 are schematic diagrams of fabrication process of semiconductor device having metal gate according to an embodiment of the present invention, wherein FIG. 2 is a schematic drawing of cross-sectional view of the semiconductor device mentioned in the embodiment;

FIG. 3 is a schematic drawing in a step subsequent to FIG. 2;

FIG. 4 is a schematic drawing in a step subsequent to FIG. 3;

FIG. 5 is a schematic drawing in a step subsequent to FIG. 4;

FIG. 6 is a schematic drawing in a step subsequent to FIG. 5;

FIG. 7 is a schematic drawing in a step subsequent to FIG. 6;

FIG. 8 is a schematic drawing in a step subsequent to FIG. 7;

FIG. 9 is a schematic drawing in a step subsequent to FIG. 8; and

FIG. 10 is a schematic drawing in a step subsequent to FIG. 9, and

FIG. 10 also shows a sectional view of the structure of the semiconductor device having metal gate according to an embodiment of the present invention.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate on the contents and effects to be achieved.

Figure 1:
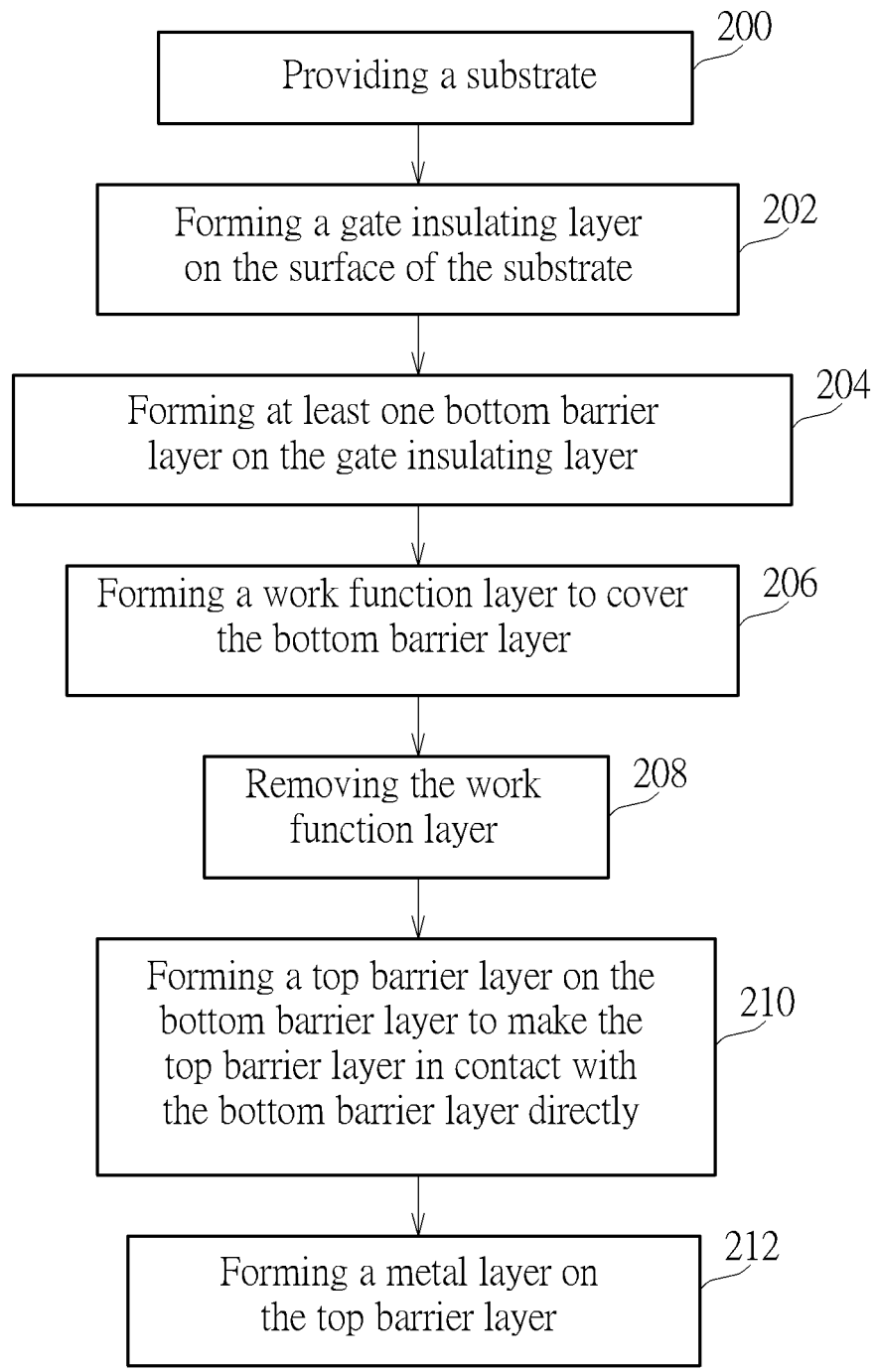
FIG. 1 is a process flow chart of the fabrication method of a semiconductor device having metal gate according to the present invention.
Figure 2:
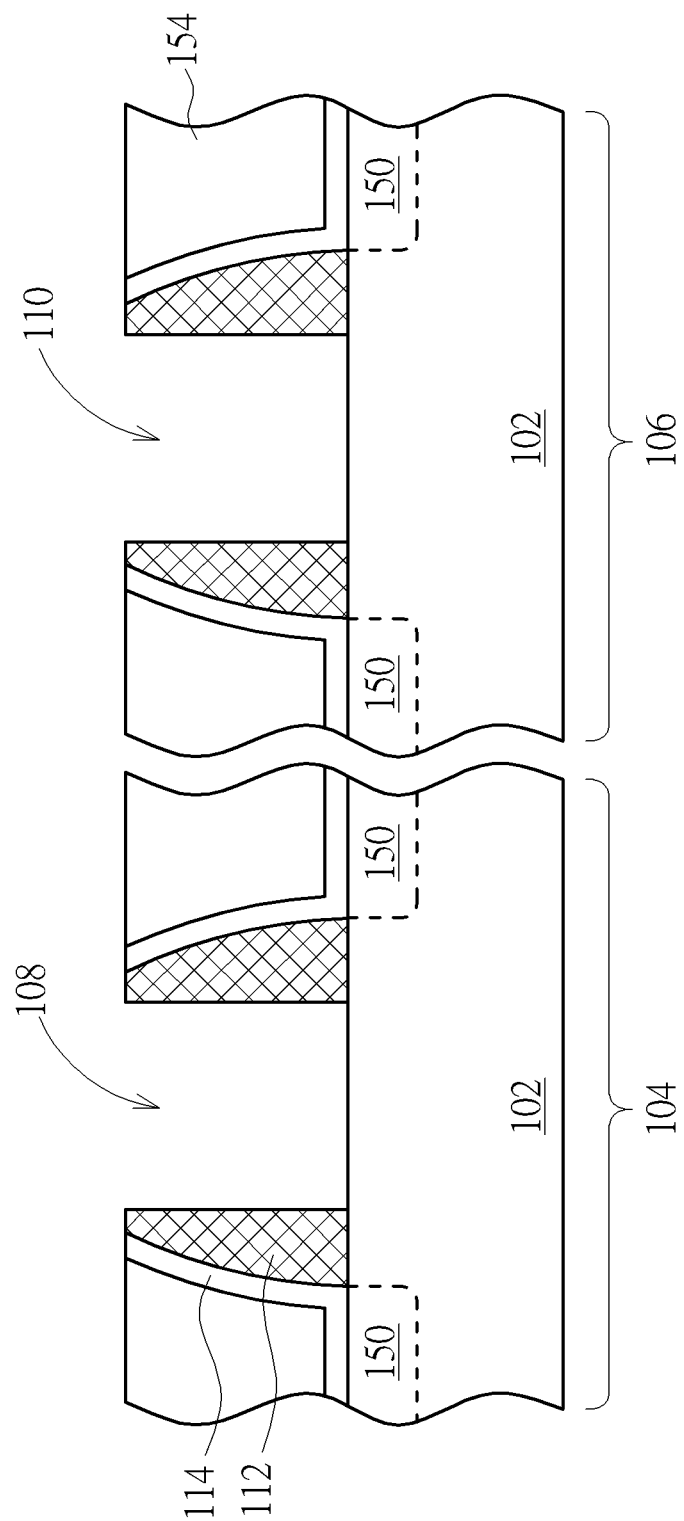

Please refer to FIG. 1 and FIG. 2 to FIG. 11. FIG. 1 is a process flowchart of the fabrication method of a semiconductor device having metal gate according to the present invention. FIG. 2 to FIG. 10 are schematic diagrams of fabrication process of the present invention semiconductor device having metal gate according to an embodiment of the present invention, wherein FIG. 10 also illustrates the schematic diagram of the sectional view of the structure of semiconductor device having metal gate of the present invention. It should be noted that this embodiment introduces the fabrication method of the present invention when being applied to a gate-last process of formation of semiconductor device, but the present invention may also be applied to gate-first process of formation of semiconductor device. According to this embodiment, the Step 200 shown in FIG. 1 is first carried out to provide a substrate 102, as shown in FIG. 2. As an example, the substrate 102 may be silicon substrate, a silicon containing substrate (such as a silicon carbide (SiC) substrate), a III-V group-on-silicon (such as GaN-on-silicon) substrate, a graphene-on-silicon substrate, a silicon-on-insulator (SOI) substrate, an epitaxial layer containing substrate, or any other suitable semiconductor substrate, but not limited thereto. The substrate 102 includes a first device region 106 and a second device region 104 thereon. In this embodiment, a P-type transistor (or called P-type field effect transistor, PFET) and an N-type transistor (or called N-type field effect transistor, NFET) are predetermined to be formed in the first device region 106 and the second device region 104 respectively, but not limited thereto. For example, in other embodiments, the fabrication method of the present invention may be applied for only fabricating NFET or PFET, or for fabricating NFET or PFET individually. Since this embodiment introduces a gate-last process as an example, silicon material may be used to form patterned dummy gates (not shown) respectively in the first device region 106 and the second device region 104 on the surface of the substrate 102. Thereafter, fabrication processes of other transistor elements are following carried out, such as forming spacers 112 on the sidewalls of the dummy gates, performing light doped drain (LDD) ion implantation process, performing embedded epitaxial process of source/drain (not shown), forming a contact etch stop layer (CESL) 114, performing an ion implantation process to form sources/drains 150, forming inter-layer dielectric (ILD) layer 154, and performing chemical mechanical polishing (CMP) process. Then, the polysilicon dummy gates are removed to form at least one gate trench respectively in the first device region 106 and the second device region 104 respectively, as the first gate trench 110 and the second gate trench 108 shown in FIG. 2.

Figure 3:
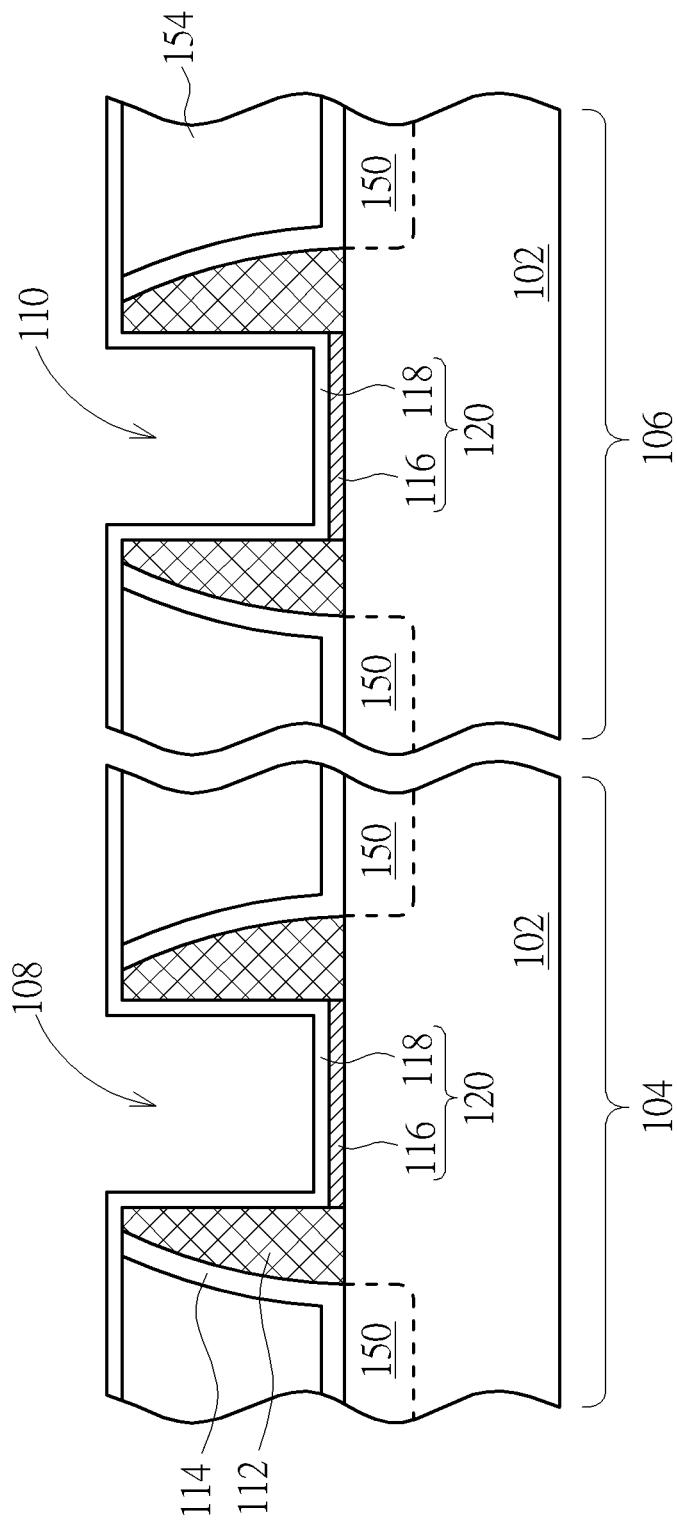

Referring to FIG. 3 and FIG. 1, the Step 202 shown in FIG. 1 is then carried out. A gate insulating layer 120 is formed on the substrate 102. The gate insulating layer 120 of this embodiment is formed on the bottoms and sidewalls of the first gate trench 110 and the second gate trench 108 and the surface of the ILD layer 154. The gate insulating layer 120 may selectively include an oxide layer 116 and a high dielectric constant (high-k) dielectric layer 118. The oxide layer 116 may be a silicon dioxide layer for instance. As an example, the silicon dioxide layer may be formed on the bottom surfaces of the first gate trench 110 and the second gate trench 108 through a thermal oxidation process. The high-k dielectric layer 118 may be formed through a deposition process to cover the surface of the oxide layer 118 and the sidewalls of the first gate trench 110 and the second gate trench 108. The high-K dielectric layer 118 may include the material with dielectric constant greater than about 4, which could be a rare earth metal or a lanthanide metal oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide, ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT), and barium strontium titanate ($Ba_xSr_{1-x}TiO_3$, BST).

Figure 4:
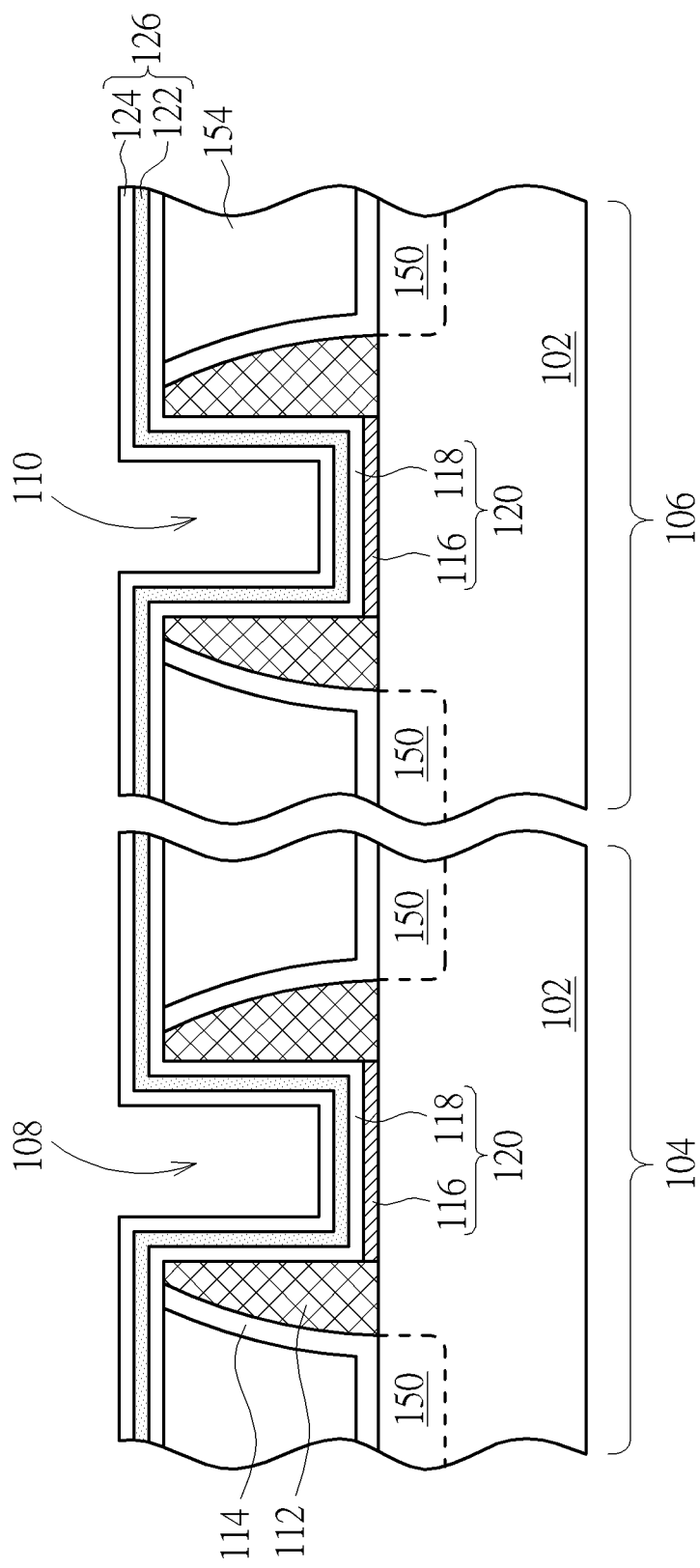

Referring to FIG. 4 and FIG. 1, the Step 204 shown in FIG. 1 is then carried out to form at least one bottom barrier layer 126 on the surface of the gate insulating layer 120, covering the bottoms and sidewalls of the first gate trench 110 and the second gate trench 108. The bottom barrier layer 126 of this embodiment has a multi-layer structure that includes a lower bottom barrier layer 122 and an upper bottom barrier layer 124. The lower bottom barrier layer 122 and the upper bottom barrier layer 124 may have identical or different materials. In a preferable embodiment, the bottom barrier layer 126 includes metal compound material. As an example, the lower bottom barrier layer 122 of this embodiment includes material of titanium nitride (TiN), and the upper bottom barrier layer 124 of this embodiment includes tantalum nitride (TaN), which means the bottom barrier layer 126 is a TiN/TaN stacking layer, but not limited thereto. The bottom barrier layer 126 may include other materials, such as titanium silicon nitride (TiSiN). In other embodiments, the bottom barrier layer 126 may be a single layer.

Figure 5:
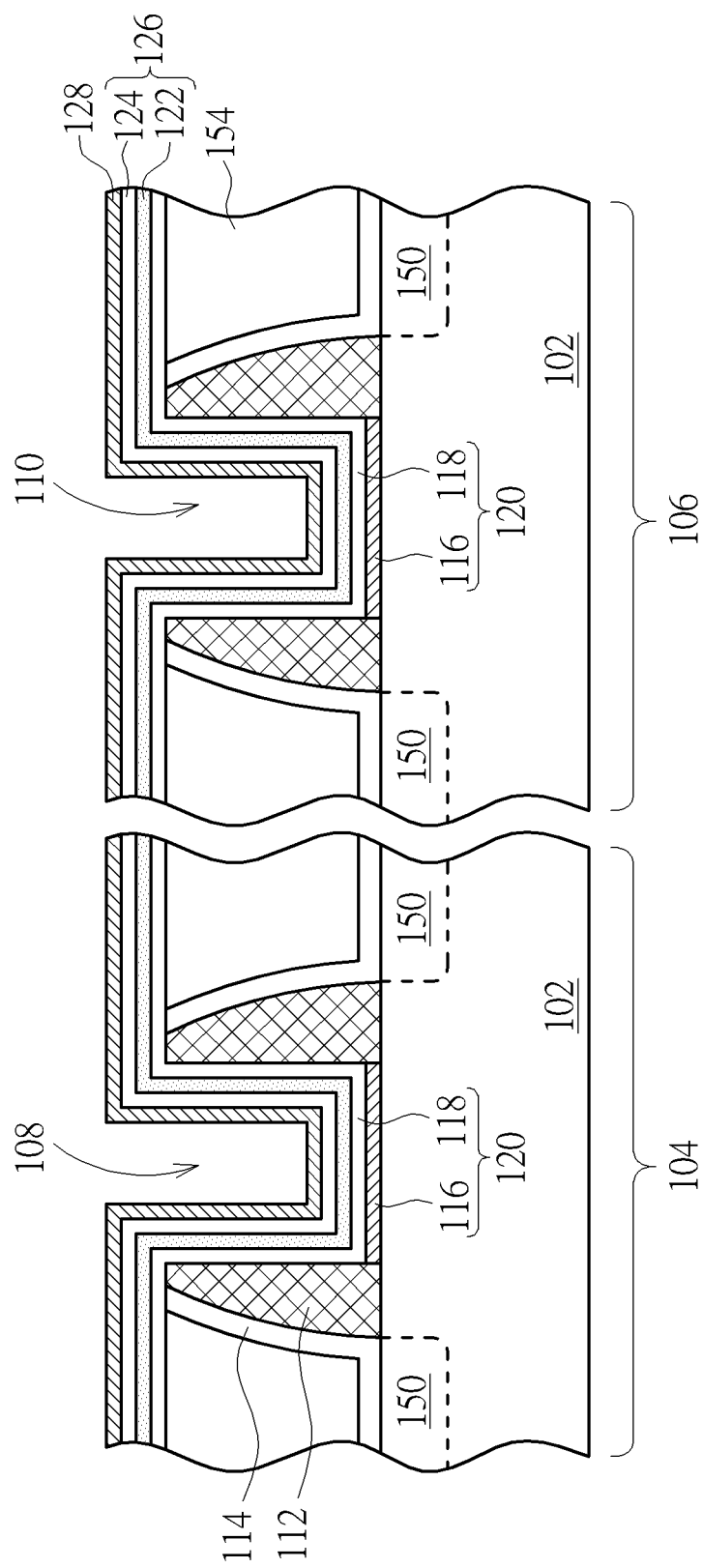
Figure 6:
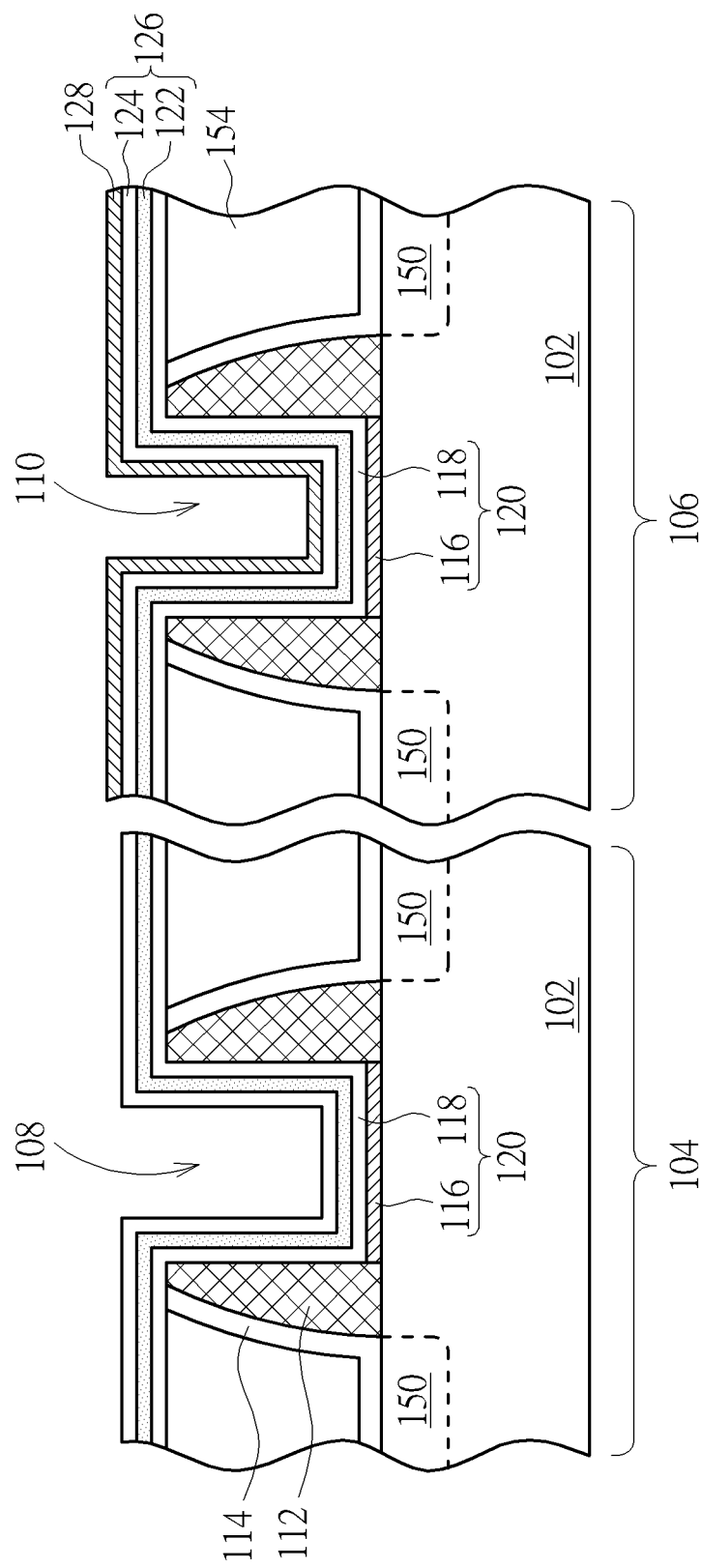

Referring to FIG. 5 and FIG. 1, the Step 206 of FIG. 1 is then carried out to form a work function layer on the bottom barrier layer 126 to cover the bottom barrier layer 126. According to this embodiment, both N-type transistor and P-type transistor are predetermined to be formed on the substrate 102, thus work function layers with different conductivity types have to be formed individually. As shown in FIG. 5, a first work function layer 128 is first blanketly formed on the substrate 102, which conformally covers the bottom barrier layer 126 along the profile surface of the first gate trench 110 and the second gate trench 108. The first work function layer 128 may be formed through a chemical vapor deposition (CVD) process or a physical vapor deposition (PVD) process. The first work function layer 128 is a P-type work function metal layer with a work function value ranging from about 4.8 eV to about 5.2 eV. For example, the first work function layer 128 may be made of a material including titanium nitride, titanium carbide (TiC), tantalum nitride or tantalum carbide (TaC), tungsten carbide (WC), or aluminum titanium nitride (TiAlN), but not limited thereto. Then, referring to FIG. 6, the first work function layer 128 disposed in the second device region 104 is removed. For example, the removal of the first work function layer 128 in the second device region 104 may include first forming a patterned mask layer (such as a patterned photoresist layer, not shown) in the first device region 106 to cover the first work function layer 128 within the first device region 106, and then performing an etching process to remove the first work function layer 128 not covered by the patterned mask layer, which means removing the first work function layer 128 disposed on the substrate 102 in the second device region 104.

Figure 7:
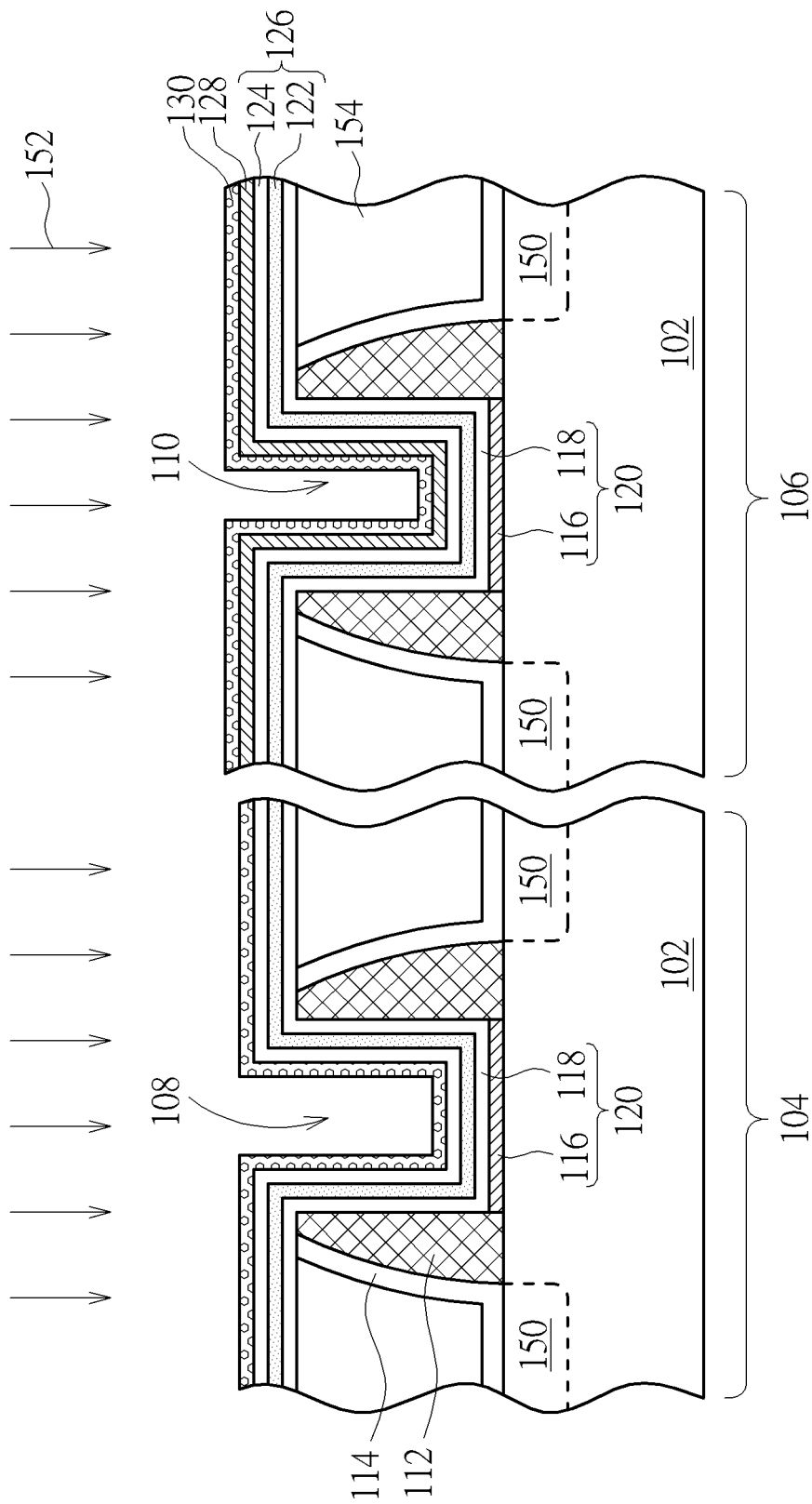

Then, referring to FIG. 7, a second work function layer 130 is blanketly and conformally formed along the profile surface of the substrate 102 to fill the second gate trench 108 in the second device region 104 and directly cover and contact with the upper bottom barrier layer 124. Simultaneously, the second work function layer 130 also fills the first gate trench 110 in the first device region 106 to directly cover the first work function layer 128 and directly contact with the first work function layer 128. The second work function layer 130 of this embodiment is an N-type work function metal layer which may be formed through a CVD process or a PVD process. The second work function layer 130 has a work function value ranging from about 3.9 eV to about 4.3 eV, whose material may be, but not limited to, titanium aluminide (TiAl), zirconium aluminide (ZrAl), tungsten aluminide (WAl), tantalum aluminide (TaAl), or hafnium aluminide (HfAl) for instance. Sequentially, a work function tuning process 152 may be selectively performed, such as a heat treatment process, an ion implantation process, or a nitridation process, but not limited thereto. The aforementioned work function tuning process 152 act on restraining the atoms or impurities in the first work function layer 128 and the second work function layer 130 from diffusion or driving these atoms to diffuse into the layers covered by the first work function layer 128 and the second work function layer 130.

Figure 8:
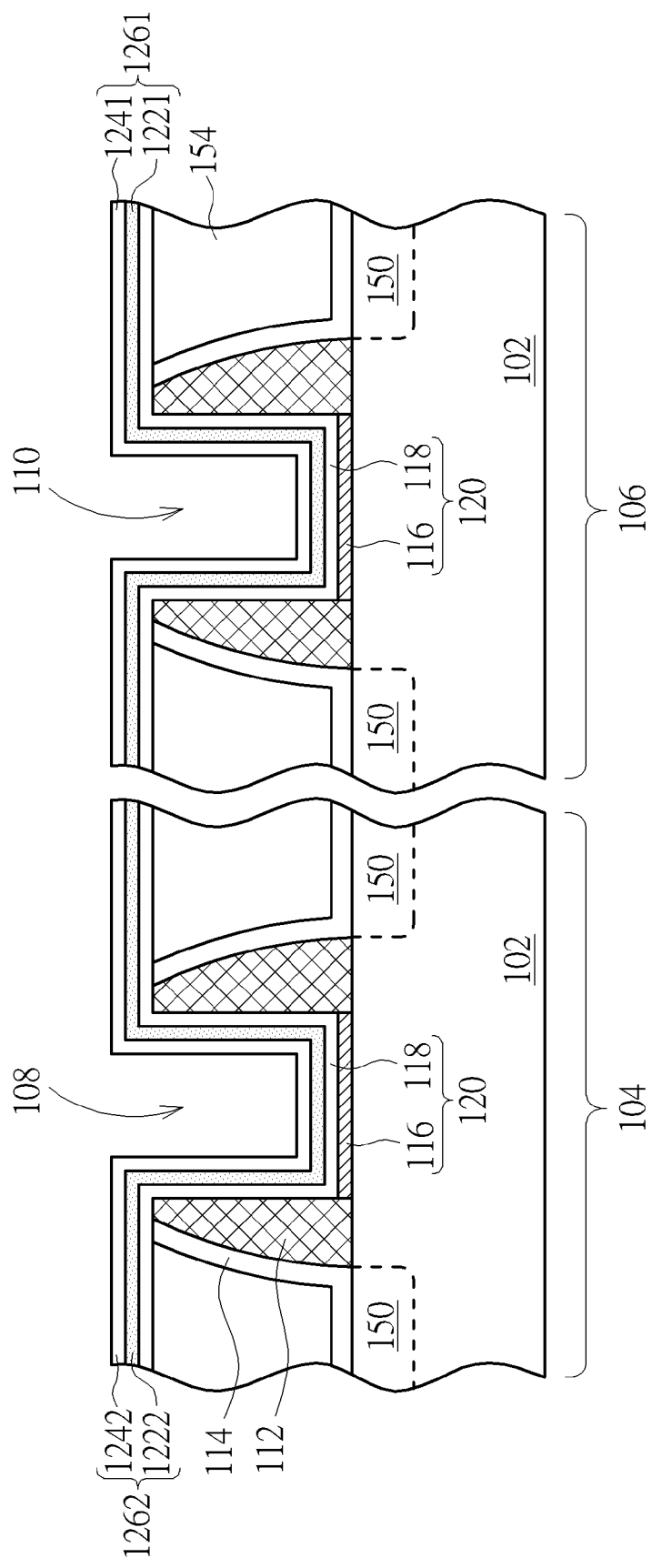

Sequentially, referring to FIG. 8 and FIG. 1, the Step 208 is performed to remove all the work function layers, including the first work function layer 128 and the second work function layer 130. The step of removal of the work function layers may include a wet etching process for instance, while the adopted etchant preferably has a high etching selectivity ratio of the materials of the first work function layer 128 and the second work function layer 130 to the material of the bottom barrier layer 126, but not limited thereto. Dry etching process and other well-known removing process for layers may be adopted for removing the work function layers. After removing the first work function layer 128 and the second work function layer 130, the bottom barrier layers of the first device region 106 and the second device region 104 are exposed on the bottoms and sidewalls of the first gate trench 110 and the second gate trench 108. It is noteworthy that the first gate trench 110 and the second gate trench 108 respectively suffer different fabrication processes before the Step 208 so that the impurity compositions of their exposed bottom barrier layers are various after the removal process of Step 208. As a result, in FIG. 8, the bottom barrier layers with various impurity compositions and contents of the first device region 106 and the second device region 104 are marked with different numerals respectively, wherein the first bottom barrier layer 1261 is disposed in the first device region 106 that has a lower bottom barrier layer 1221 and an upper bottom barrier layer 1241, and the second bottom barrier layer 1262 is disposed in the second device region 104 that has a lower bottom barrier layer 1222 and an upper bottom barrier layer 1242.

Figure 9:
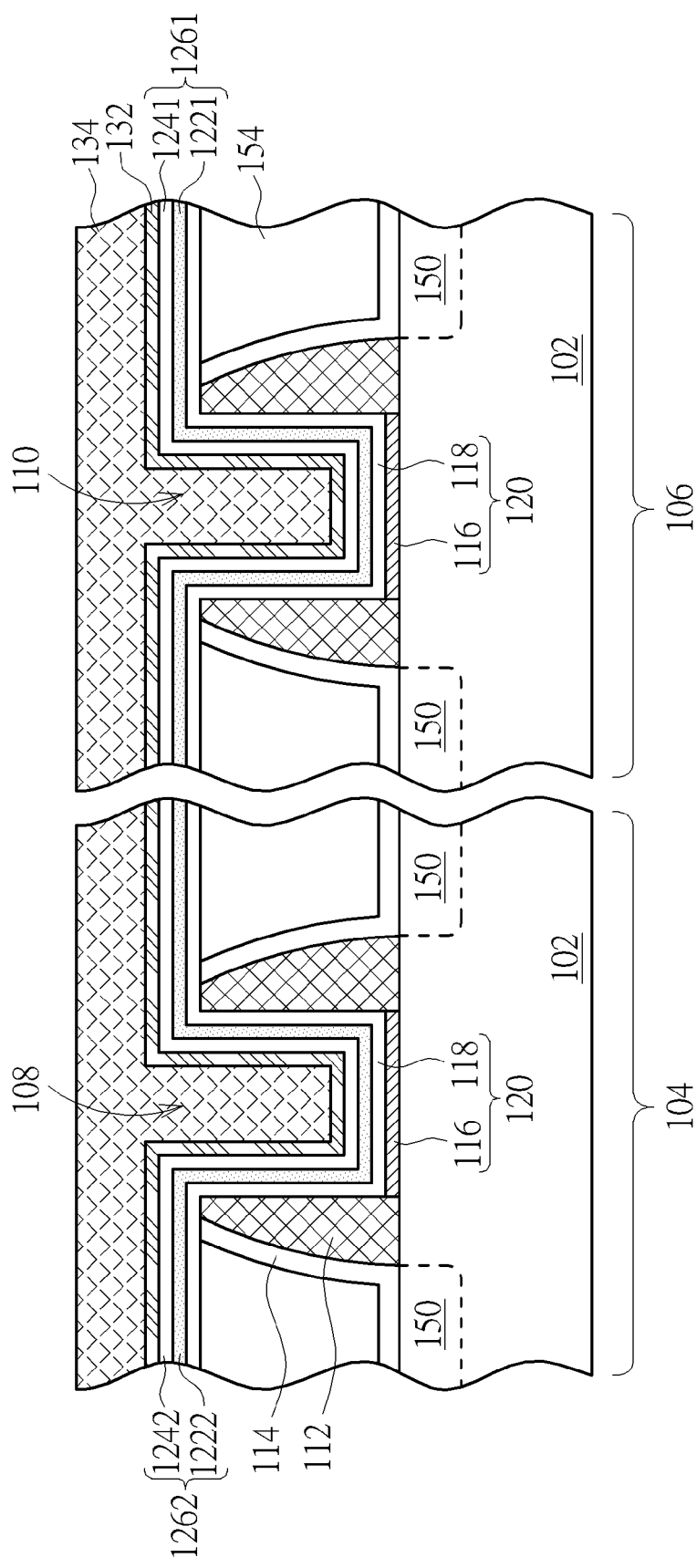

Referring to FIG. 9 and FIG. 1, Step 210 is then carried out. A top barrier layer 132 is formed on the first bottom barrier layer 1261 and the second bottom barrier layer 1262 to enable the top barrier layer 132 to directly cover the surfaces of the first bottom barrier layer 1261 and the second bottom barrier layer 1262, wherein the top barrier layer 132 is directly in contact with the surfaces of the first bottom barrier layer 1261 and the second bottom barrier layer 1262. For example, the top barrier layer 132 may be formed through a PVD process or a CVD process and may include a material of TiN, but not limited thereto. After that, Step 212 shown in FIG. 1 is carried out to form a metal layer 134 on the top barrier layer 132, filling the first gate trench 110 and the second gate trench 108. Preferably, metal materials with low resistance is selected for the metal layer 134, such as tungsten (W), but not limited thereto. Aluminum (Al), titanium aluminide (TiAl), titanium aluminum oxide (TiAlO), or other metal materials or metal oxide materials with superior hole-filling ability and low resistance may also be selected for the metal layer 134.

Figure 10:
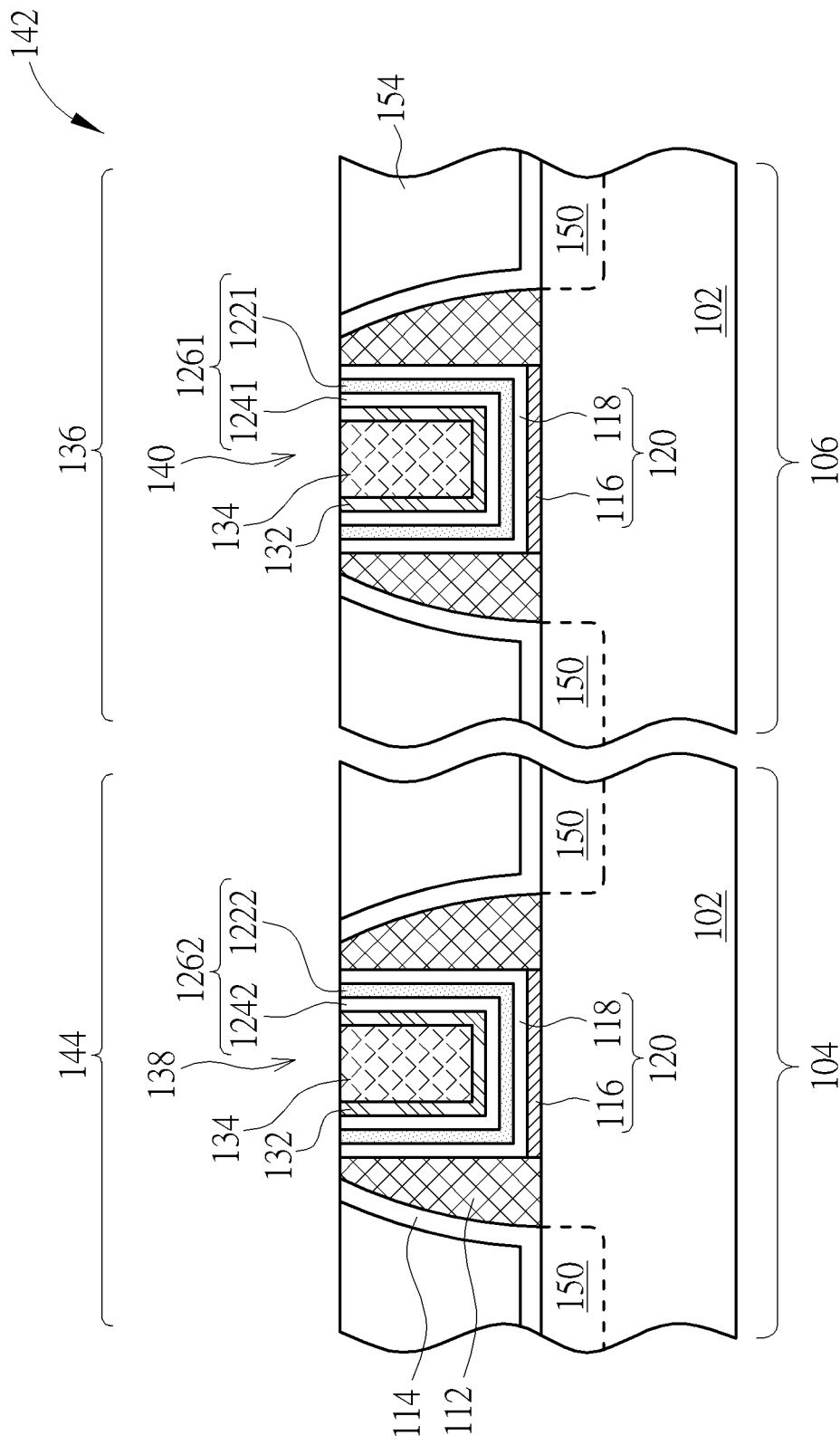

Referring to FIG. 10, then, a planarization process may be performed, such as a CMP process, in order to remove the superfluous metal layer 134, top barrier layer 132, first and second bottom barrier layers 1261, 1262, and gate insulating layer 120 (high-K dielectric layer 118) that exceed the top surface of the ILD layer 154, so as to form a first metal gate structure 140 and a second metal gate structure 138 respectively. Accordingly, the fabrication of the first transistor 136 and the second transistor 144 is complete. The first transistor 136 disposed in the first device region 106 is a P-type transistor and the first metal gate structure 140 is a P-type gate structure. The second transistor 144 disposed in the second device region 104 is an N-type transistor and the second metal gate structure 138 is an N-type metal gate. After that, the ILD layer 154 and the CESL 114 of this embodiment may be selectively removed, and new CESL and ILD layer may be reformed in order to effectively raise the electric performance of the semiconductor device. In addition, after the formation of the first transistor 136 and the second transistor 144, a self-alignment contact (SAC) process may be performed to form contact holes and contact plugs. Since the above-mentioned CMP process, reformation of the CESL and ILD layer, and SAC process are known processes for those skilled in the art, no detailed description will be provided herein.

From the above, according to the fabrication method of the semiconductor device having metal gate of the present invention, the semiconductor device 142 having metal gate shown in FIG. 10 is provided. The semiconductor device 142 having metal gate includes a substrate 102, a first metal gate structure 140, and a second metal gate structure 138. The substrate 102 includes a first device region 106 and a second device region 104, and the first metal gate structure 140 and the second metal gate structure 138 are disposed in the first device region 106 and the second device region 104 respectively. The first metal gate structure 140 includes the gate insulating layer 120 and the first bottom barrier layer 1261 disposed on the substrate 102 in order, the top barrier layer 132 disposed on the surface of the first bottom barrier layer 1261, directly in contact with the first bottom barrier layer 1261, and the metal layer 134 disposed on the top barrier layer 132. The second metal gate structure 138 includes the gate insulating layer 120 and the second bottom barrier layer 1262 disposed on the substrate 102 in order, the top barrier layer 132 disposed on the second bottom barrier layer 1262, directly in contact with the second bottom barrier layer 1262, and the metal layer 134 disposed on the top barrier layer 132. It is noteworthy that the first bottom barrier layer 1261 of the first metal gate structure 140 and the second bottom barrier layer 1262 of the second metal gate structure 138 have different impurity compositions and contents because the first work function layer 128 and the second work function layer 130 of the first gate trench 110 and the second gate trench 108 are formed and removed through different processes.

Figure 11:
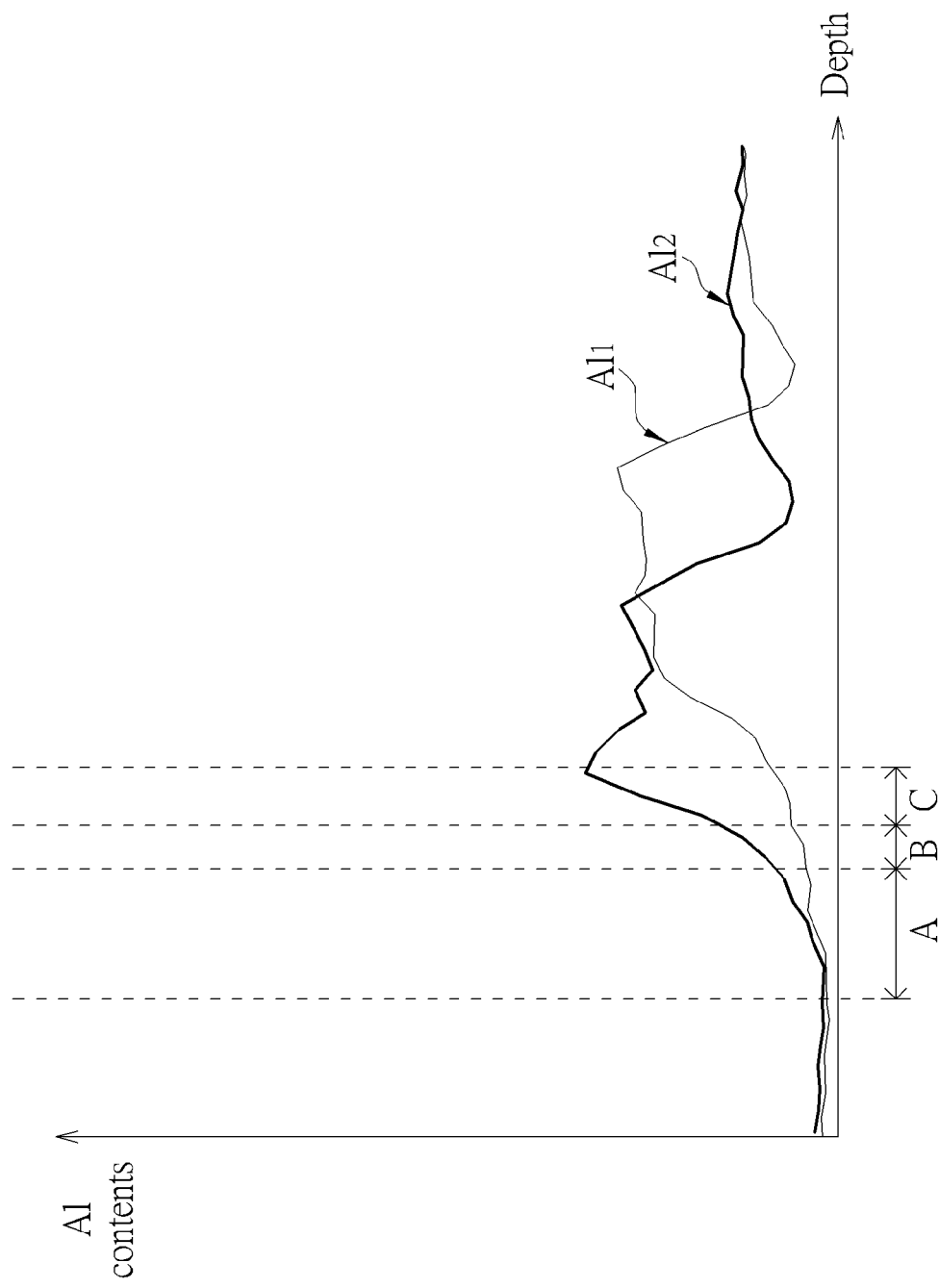
FIG. 11 is an energy-dispersive X-ray spectroscopy (EDS) diagram of the semiconductor device having metal gate of the present invention.

Referring to FIG. 11, FIG. 11 is an energy-dispersive X-ray spectroscope (EDS) diagram of the semiconductor device 142 having metal gate of the present invention. Curve $Al_1$ and curve $Al_2$ represent the aluminum atom contents of the first transistor 136 and the second transistor 144 respectively, wherein the section A of the horizontal axis represents the aluminum atom content of the high-K dielectric layer of the transistor, the section B represents the aluminum atom content of the bottom barrier layer, and the section C represents the aluminum atom content of the top bottom barrier layer. In the section B and section C shown in FIG. 11, curve $Al_1$ and curve $Al_2$ do not overlap and cross with each other, and curve $Al_1$ keeps on staying underneath curve $Al_2$. Accordingly, the first bottom barrier layer 1261 and the second bottom barrier layer 1262 have different aluminum atom contents, wherein the aluminum atom content of the first bottom barrier layer 1261 is less than that of the second bottom barrier layer 1262. Furthermore, the trends of curve $Al_1$ and curve $Al_2$ in section B and section C are quite different. The trend of curve $Al_1$ is more gradual but curve $Al_2$ has a trend with steeper gradient. As a result, the first bottom barrier layer 1261 and the second bottom barrier layer 1262 have different concentration gradient of aluminum atom. From the above, the first bottom barrier layer 1261 and the second bottom barrier layer 1262 have various impurity compositions, which provide different work function effects for the metal gate structures. Therefore, even though both the finally formed first metal gate structure 140 and the second metal gate structure 138 do not have work function material layer and it is seemed that they have the same amount of stacking layers and layer stacking structure, the first metal gate structure 140 and the second metal gate structure 138 provide metal gates with different conductivity types for being applied to transistors with different conductive types, meaning applied to a P-type transistor and an N-type transistor respectively.

It should be noted that the above-mentioned embodiment of the present invention is applied to a gate-last fabrication process, but the present invention may be applied to a gate-first fabrication process. For example, the fabrication process may include successively forming a gate insulating layer, a bottom barrier layer, and a work function layer on the substrate, selectively performing a work function tuning process, removing the work function layer, and then forming the top barrier layer and the metal layer on the surface of the bottom barrier layer sequentially. After that, the metal gate structure is patterned, followed by forming a spacer on the sidewall of the metal gate structure and forming other transistor elements, such as LDD, source/drain and CESL. In addition, in the gate-last fabrication process of the aforementioned embodiment, although the high-K dielectric layer is fabricated after forming the gate trench, in other variant embodiments the high-K dielectric layer may be formed on the surface of the substrate before forming other transistor elements (such as the dummy gate, spacer, LDD, source/drain and CESL), followed by removing the dummy gate to form gate trench and expose the pre-formed high-K dielectric layer and the other fabrication processes mentioned in the above embodiment, such as successively forming the bottom barrier layer and work function layer on the surface of the high-K dielectric layer and removing the work function layer. Detailed description of these fabrication processes will not be redundantly provided herein.

According to the fabrication method of semiconductor device having metal gate of the present invention, during fabricating the metal gate structure, the work function layer is formed on the bottom barrier layer in advance and selectively treated through a work function tuning process, followed by removing the work function layer to expose the bottom barrier layer. Then, the sequentially formed top barrier layer and metal layer are directly disposed on the surface of the bottom barrier layer, such that the top barrier layer and the bottom barrier layer are directly in contact with each other. Therefore, there is no work function layer exists in the gate trench when forming the top barrier layer and the metal layer, such that the aspect ratio of the gate trench can be effectively improved when filling the metal layer into the gate trench, so as to improve the hole-filling performance of the metal layer, as well as the electric performance of the metal gate. For example, the resistance can be effectively lowered. In addition, according to the present invention method, an extra pull-down process of the work function layer or other layers in the gate trench is not needed in the metal gate fabrication process, thus the whole fabrication process is effectively simplified. Moreover, the metal gate structures of the N-type transistor and P-type transistor have identical stacking structure of layers, thus the process window of the following fabrication process could be raised, so as to simplify the fabrication process and improve the fabrication yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabrication method of a semiconductor device having metal gate, comprising:
   providing a substrate;
   forming a gate insulating layer on a surface of the substrate;
   forming a bottom barrier layer on the gate insulating layer;
   forming a work function layer on the bottom barrier layer to cover the bottom barrier layer;
   removing the work function layer;
   forming a top barrier layer on the bottom barrier layer, wherein the top barrier layer is directly in contact with the bottom barrier layer; and
   forming a metal layer on the top barrier layer.

2. The fabrication method of a semiconductor device having metal gate according to claim 1, wherein the surface of the substrate includes at least one gate trench, and the gate insulating layer, the bottom barrier layer, the work function layer, the top barrier layer, and the metal layer are formed at least in the gate trench.

3. The fabrication method of a semiconductor device having metal gate according to claim 2, wherein the substrate having a first device region and a second device region, and the surface of the substrate includes a first gate trench and a second gate trench disposed in the first device region and the second device region respectively.

4. The fabrication method of a semiconductor device having metal gate according to claim 3, wherein the step of forming the work function layer includes:
   blanketly forming a first work function layer on the surface of the substrate to cover bottom portions and sidewalls of the first gate trench and the second gate trench;

removing the first work function layer in the second gate trench; and blanketly forming a second work function layer on the surface of the substrate to cover bottom portions and sidewalls of the first gate trench and the second gate trench.

5. The fabrication method of a semiconductor device having metal gate according to claim 4, wherein the first work function layer is a P-type work function metal layer and the second work function layer is an N-type work function metal layer.

6. The fabrication method of a semiconductor device having metal gate according to claim 1, further comprising performing a work function tuning process before removing the work function layer.

7. The fabrication method of a semiconductor device having metal gate according to claim 6, wherein the work function tuning process is a heat treatment process, an ion implantation process, or a nitridation process.

8. The fabrication method of a semiconductor device having metal gate according to claim 1, wherein the bottom barrier layer is a multi-layer structure.

9. The fabrication method of a semiconductor device having metal gate according to claim 8, wherein the multi-layer structure is a titanium nitride/tantalum nitride (TiN/TaN) stacking layer, and the top barrier layer is a titanium nitride layer.

10. The fabrication method of a semiconductor device having metal gate according to claim 1, wherein the step of removing the work function layer includes a wet etching process.

11. The fabrication method of a semiconductor device having metal gate according to claim 10, wherein an etchant used in the wet etching process has a high selectivity ratio of a material of the work function layer to a material of the bottom barrier layer.

* * * * *